United States Patent
Moon et al.

(10) Patent No.: US 10,108,032 B2
(45) Date of Patent: Oct. 23, 2018

(54) CURVED DISPLAY APPARATUS HAVING RADIALLY EXTENDING FLEXIBLE SUBSTRATES AND METHOD OF MANUFACTURING THE SAME

(71) Applicant: SAMSUNG DISPLAY CO., LTD., Yongin-si, Gyeonggi-do (KR)

(72) Inventors: Su-Mi Moon, Yongin-si (KR); Seonmi Kim, Suwon-si (KR); Chongguk Lee, Yongin-si (KR); Sehui Jang, Yongin-si (KR); Sangmoon Moh, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 57 days.

(21) Appl. No.: 15/181,884

(22) Filed: Jun. 14, 2016

(65) Prior Publication Data
US 2017/0139249 A1 May 18, 2017

(30) Foreign Application Priority Data
Nov. 18, 2015 (KR) .......................... 10-2015-0161834

(51) Int. Cl.
*G02F 1/1345* (2006.01)
*G02F 1/133* (2006.01)
(Continued)

(52) U.S. Cl.
CPC ........ *G02F 1/13306* (2013.01); *G02F 1/1368* (2013.01); *G02F 1/13452* (2013.01);
(Continued)

(58) Field of Classification Search
CPC ......... G02F 1/133305; G02F 1/133514; G02F 1/1368; G02F 1/134336; G02F 1/136286;
(Continued)

(56) References Cited

U.S. PATENT DOCUMENTS

2014/0111735 A1* 4/2014 Cho .................. G02F 1/133608
349/58
2015/0189768 A1* 7/2015 Kishida .................. H05K 1/028
361/749
2015/0316810 A1* 11/2015 Shibahara ............. G02F 1/1333
349/150

FOREIGN PATENT DOCUMENTS

KR 1020120052764 5/2012

* cited by examiner

*Primary Examiner* — Thoi Duong
(74) *Attorney, Agent, or Firm* — F. Chau & Associates, LLC.

(57) ABSTRACT

A curved display apparatus includes a curved display panel, a driver, a controller and a plurality of flexible substrates. The curved display panel extends in a tangential direction with respect to a first axis direction. The driver applies a driving signal to the curved display panel. The controller includes a curved printed circuit board extending in the tangential direction with respect to a first axis direction. The controller applies a control signal to the driver. The flexible substrates electrically connect the curved printed circuit board with the curved display panel. Each of the flexible substrates includes a first connection portion connected to the curved display panel, a second connection portion connected to the curved printed circuit board and a flexible substrate body connecting the first connection portion with the second connection portion. The flexible substrate body extends in a radial direction with respect to the first axis direction.

15 Claims, 17 Drawing Sheets

(51) Int. Cl.
  *G02F 1/1333* (2006.01)
  *G02F 1/1368* (2006.01)
  *H01L 27/12* (2006.01)
  *H01L 27/32* (2006.01)
  *H01L 51/00* (2006.01)
  *H01L 51/56* (2006.01)
  *H04N 5/44* (2011.01)

(52) U.S. Cl.
  CPC .... *G02F 1/133305* (2013.01); *H01L 27/1218* (2013.01); *H01L 27/1262* (2013.01); *H01L 27/3244* (2013.01); *H01L 51/0097* (2013.01); *H01L 51/56* (2013.01); *H04N 5/44* (2013.01); *G02F 2201/56* (2013.01)

(58) Field of Classification Search
  CPC .. G02F 1/13452; G02F 1/1333; G02F 1/1362; G02F 1/1335; G02F 1/133608; G02F 1/1345; G02F 1/13458; G02F 2201/56; G02F 2001/133388; H01L 2251/5338; H01L 51/0097; H01L 27/3276; H01L 27/3297; H01L 2225/107; H01L 23/49572; G06F 1/1652; G06F 1/1641; G06F 1/1684; G06F 2203/04102; H05K 1/147; H05K 1/189; H05K 1/028; H05K 1/0271; H05K 1/0277; H05K 1/11; H05K 1/118; H05K 2201/10128; H05K 2201/10681; H05K 2201/05; H05K 2201/09018; H05K 2201/09127; H05K 2201/10136; H05K 2201/2009; H05K 3/4691; G09G 2380/02; G09G 2300/04; G09G 2300/0408; G09F 9/301
  USPC ................ 349/43, 158, 150, 151, 149, 152; 362/631
  See application file for complete search history.

CURVED DISPLAY APPARATUS HAVING RADIALLY EXTENDING FLEXIBLE SUBSTRATES AND METHOD OF MANUFACTURING THE SAME

CROSS-REFERENCE TO RELATED APPLICATION

This application claims priority under 35 U.S.C. § 119 to Korean Patent Application No. 10-2015-0161834, filed on Nov. 18, 2015, in the Korean Intellectual Property Office (KIPO), the contents of which are incorporated by reference herein in their entirety.

TECHNICAL FIELD

Exemplary embodiments of the present invention relate to a curved display apparatus. More particularly, exemplary embodiments of the present invention relate to a curved display apparatus including radially extending flexible substrates.

DISCUSSION OF THE RELATED ART

A curved display apparatus includes a curved display panel, a display panel driver and a controller. The curved display panel includes an active region displaying an image and a peripheral region adjacent to the active region. In addition, the driver includes a data driver and a gate driver, and the driver applies a driving signal to the curved display panel. The controller may include a curved printed circuit board applying a control signal to the display panel driver.

The curved display apparatus may include a plurality of substrates electrically connecting the curved display panel with the printed circuit board. Due to the curved shape of each of the curved display panel and the curved printed circuit board, a stress may be applied to the plurality of substrates such that an electrical connection reliability of the flexible substrates decreases.

SUMMARY

According to an exemplary embodiment of the present invention, a curved display apparatus includes a curved display panel including a first substrate and a second substrate facing the first substrate, wherein the curved display panel extends in a tangential direction with respect to a first axis direction, and the first substrate includes a switching element and a pixel electrode electrically connected to the switching element. A driver is configured to apply a driving signal to the curved display panel. A controller includes a curved printed circuit board extending in the tangential direction with respect to the first axis direction, wherein the controller is configured to apply a control signal to the driver. A plurality of flexible substrates electrically connect the curved printed circuit board with the curved display panel. Each of the plurality of flexible substrates includes a first connection portion connected to the curved display panel, a second connection portion connected to the curved printed circuit board, and a flexible substrate body connecting the first connection portion with the second connection portion, wherein the flexible substrate body extends in a radial direction with respect to the first axis direction.

In an exemplary embodiment of the present invention, the plurality of first connection portions are equally spaced apart from one another, and the plurality of second connection portions are equally spaced apart from one another.

In an exemplary embodiment of the present invention, a first pair of adjacent first connection portions of the plurality of first connection portions are spaced apart from one another by a first distance, and a second pair of adjacent first connection portions of the plurality of first connection portions are spaced apart from one another by a second distance different than the first distance. A first pair of adjacent second connection portions of the plurality of second connection portions are spaced apart from one another by a third distance, and a second pair of adjacent second connection portions of the plurality of second connection portions are spaced apart from one another by a fourth distance different than the third distance.

In an exemplary embodiment of the present invention, at least one of the plurality of flexible substrates has a rectangular shape.

In an exemplary embodiment of the present invention, at least one of the plurality of flexible substrates has a trapezoidal shape.

In an exemplary embodiment of the present invention, for the at least one of the plurality of flexible substrates having the trapezoidal shape, a length of the first connection portion along the tangential direction with respect to the first axis direction is less than a length of the second connection portion along the tangential direction with respect to the first axis direction.

In an exemplary embodiment of the present invention, at least one of the plurality of flexible substrates has a dumbbell shape.

In an exemplary embodiment of the present invention, for the at least one of the plurality of flexible substrates having the dumbbell shape, a length of the first connection portion along the tangential direction with respect to the first axis direction is less than a length of the second connection portion along the tangential direction with respect to the first axis direction.

In an exemplary embodiment of the present invention, at least one of the plurality of flexible substrates includes polyimide.

In an exemplary embodiment of the present invention, the curved display panel includes an active region configured to display an image and a peripheral region disposed adjacent to the active region. Each of the plurality of first connection portions is connected to the peripheral region of the curved display panel.

In an exemplary embodiment of the present invention, the driver includes a plurality of data drivers. Each of the plurality of data drivers is mounted on a respective one of the plurality of flexible substrates as a chip on film (COF).

In an exemplary embodiment of the present invention, the driver includes a plurality of data drivers. Each of the plurality of data drivers is mounted on the first substrate of the flexible display panel as a chip on glass (COG).

In an exemplary embodiment of the present invention, the driver includes a gate driver. The gate driver is directly mounted on the first substrate of the flexible display panel as an amorphous silicon gate (ASG).

In an exemplary embodiment of the present invention, the curved display panel further includes a liquid crystal layer or an organic light emitting layer interposed between the first substrate and the second substrate.

According to an exemplary embodiment of the present invention, a method of manufacturing a curved display apparatus includes providing a flat display panel including a first substrate and a second substrate facing the first substrate, wherein the first substrate includes a switching element and a pixel electrode electrically connected to the switching element. A flat printed circuit board and a plurality of flexible substrates are provided, wherein each of the plurality of flexible substrates includes a first connection portion, a second connection portion, and a flexible substrate body connecting the first and second connection portions. The first connection portions of the plurality of flexible substrates are connected on the flat display panel along a first direction, wherein the first connection portions of the plurality of flexible substrates are spaced apart from one another. The second connection portions of the plurality of flexible substrates are connected on the flat printed circuit board along the first direction, wherein the second connection portions of the plurality of flexible substrates are spaced apart from one another. A first pair of two second connection portions of the plurality of flexible substrates are spaced apart from each other by a first distance. A second pair of two second connection portions of the plurality of flexible substrates are spaced apart from each other by a second distance different from the first distance.

In an exemplary embodiment of the present invention, a distance between two second connection portions of the plurality of flexible substrates adjacent to each other increases when a distance between a center line of the flat display panel and the two second connection portions of the plurality of flexible substrates increases.

In an exemplary embodiment of the present invention, the method of manufacturing a curved display apparatus further includes bending the flat display panel to form a curved display panel and bending the flat printed circuit board to form a curved printed circuit board.

In an exemplary embodiment of the present invention, after bending the flat display panel and the flat printed circuit board, the flexible substrate body of each of the plurality of flexible substrates extends in a radial direction with respect to a first axis direction, wherein the curved display panel and the curved printed circuit board are curved with respect to the first axis direction.

In an exemplary embodiment of the present invention, the first connection portion of each of the plurality of flexible substrates is connected to the flat display panel by a thermal compression process, and the second connection portion of each of the plurality of flexible substrates is connected to the flat printed circuit board by the thermal compression process.

In an exemplary embodiment of the present invention, the curved display panel includes an active region displaying an image and a peripheral disposed adjacent to the active region. The first connection portions of the plurality of flexible substrates are connected to the peripheral region of the curved display panel.

According to an exemplary embodiment of the present invention, a curved display apparatus includes a curved display panel including a first substrate and a second substrate facing the first substrate, wherein the curved display panel is curved along a portion of a first imaginary circle, wherein the first substrate includes a switching element and a pixel electrode electrically connected to the switching element. A driver is configured to apply a driving signal to the curved display panel. A controller includes a curved printed circuit board, wherein the curved printed circuit board is curved along a portion of a second imaginary circle that has a same center as the first imaginary circle, wherein the controller is configured to apply a control signal to the driver. A plurality of flexible substrates electrically connect the curved printed circuit board with the curved display panel. Each of the plurality of flexible substrates includes a first connection portion connected to the curved display panel, a second connection portion connected to the curved printed circuit board, and a flexible substrate body connecting the first connection portion with the second connection portion, wherein the flexible substrate body extends in a radial direction with respect to the center of the first imaginary circle.

In an exemplary embodiment of the present invention, the curved display panel and the curved printed circuit board overlap.

BRIEF DESCRIPTION OF THE DRAWINGS

Exemplary embodiments of the present invention will become more clearly understood from the following detailed description taken in conjunction with the accompanying drawings, in which.

DETAILED DESCRIPTION OF THE EMBODIMENTS

Figure 1:
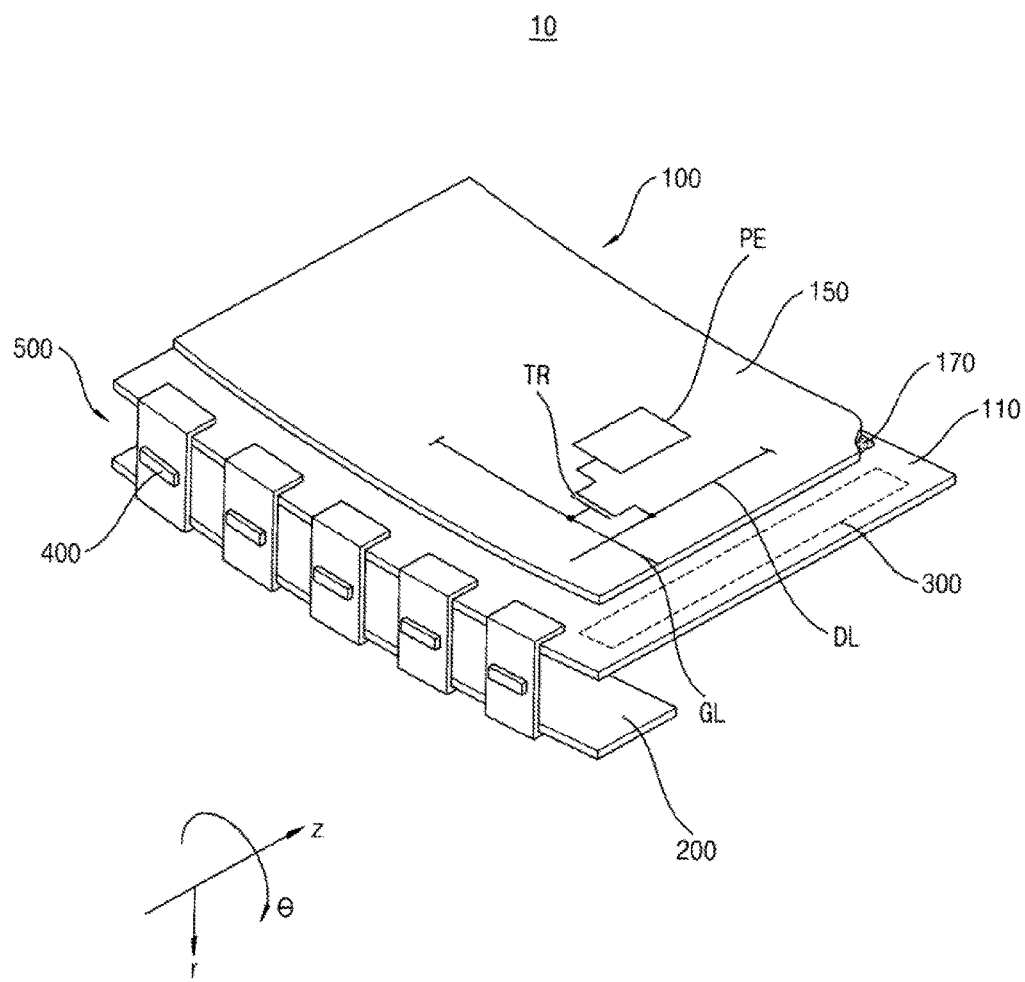
FIG. 1 is a perspective view illustrating a curved display apparatus according to an exemplary embodiment of the present invention.

Various exemplary embodiments of the present invention will be described more fully hereinafter with reference to the accompanying drawings. The present invention may, however, be embodied in many different forms and should not be construed as limited to the exemplary embodiments thereof set forth herein. Like reference numerals may refer to like elements throughout this application.

Figure 2:
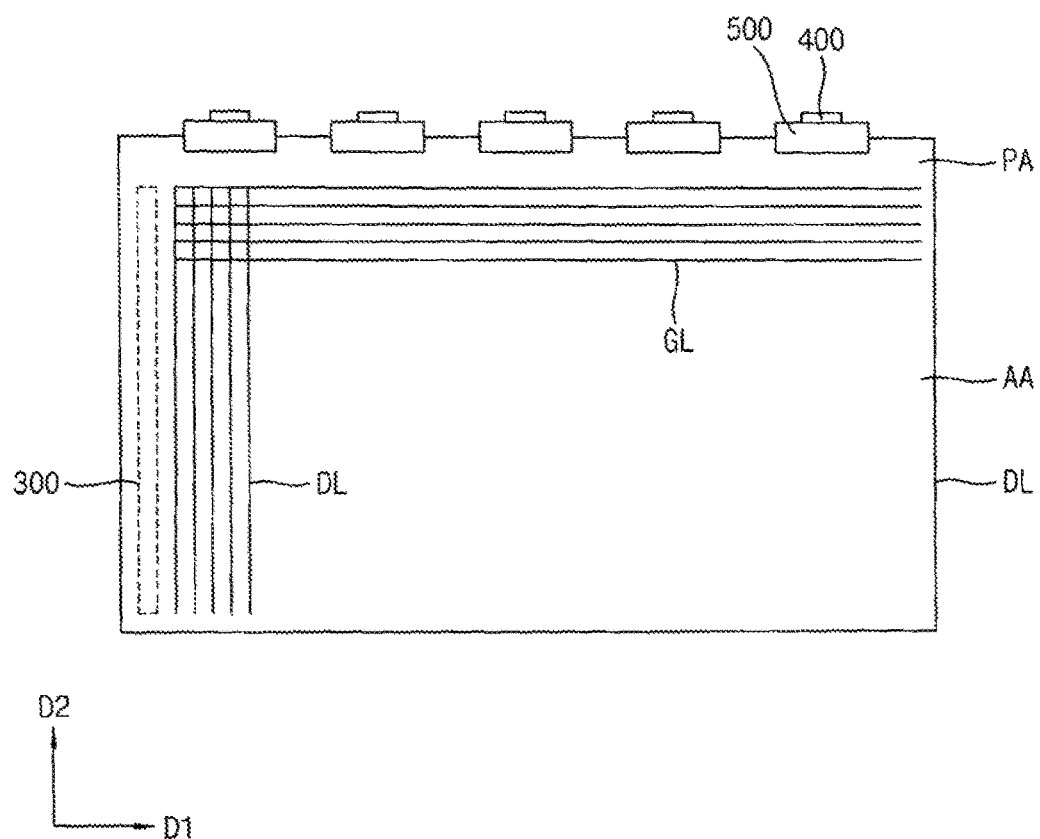
FIG. 2 is a plan view illustrating the curved display apparatus of FIG. 1, according to an exemplary embodiment of the present invention.
Figure 3:
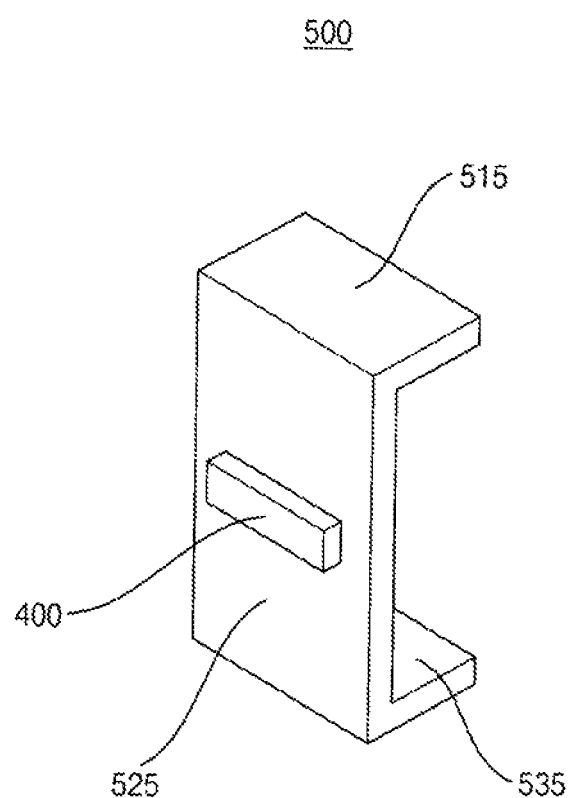
FIG. 3 is a perspective view illustrating a flexible substrate of FIG. 1, according to an exemplary embodiment of the present invention.
Figure 4:
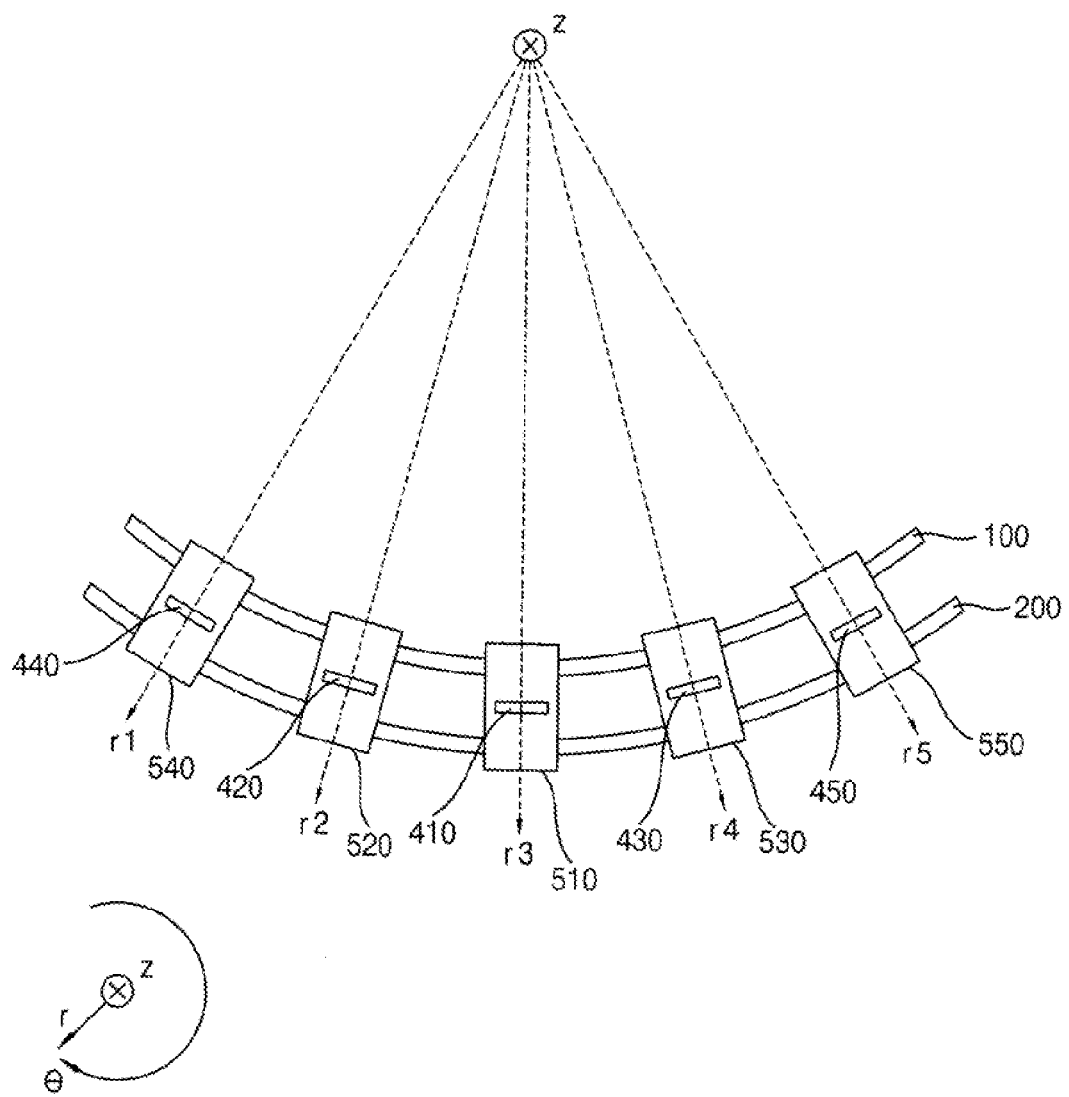
FIG. 4 is a side view in an axial direction illustrating the curved display apparatus of FIG. 1, according to an exemplary embodiment of the present invention.

FIG. 1 is a perspective view illustrating a curved display apparatus according to an exemplary embodiment of the present invention. FIG. 2 is a plan view illustrating the curved display apparatus of FIG. 1, according to an exemplary embodiment of the present invention. FIG. 3 is a perspective view illustrating a flexible substrate of FIG. 1, according to an exemplary embodiment of the present invention. FIG. 4 is a side view in an axial direction illustrating the curved display apparatus of FIG. 1, according to an exemplary embodiment of the present invention.

Referring to FIGS. 1 to 4, a curved display apparatus 10 includes a curved display panel 100, a driver, a controller, and a plurality of flexible substrates 500.

The curved display panel 100 includes an active region AA on which an image is displayed, and a peripheral region PA adjacent to the active region AA. The peripheral region PA does not display an image. The active region AA may be referred to as a display region.

As illustrated in FIG. 2, in a plan view, the curved display panel 100 includes a plurality of gate lines GL, each of which extends in a first direction D1, and a plurality of data lines DL, each of which extends in a second direction D2 crossing the first direction D1.

The curved display panel 100 includes a plurality of pixels. The pixels are electrically connected to the gate lines GL and the data lines DL. The gate lines GL, the data lines DL and the pixels are disposed in the active region AA of the curved display panel 100.

Each pixel includes a switching element TR electrically connected to each of the gate lines GL and a respective one of the data lines DL. The pixels may be disposed in a matrix form.

The curved display panel 100 may include a first substrate 110 and a second substrate 150 opposite to the first substrate 110.

For example, the first substrate 110 may be an array substrate. The gate lines GL and the data lines DL may be disposed on the first substrate 110. A plurality of switching elements TR connected to the gate lines GL and the data lines DL may be disposed on the first substrate 110. A pixel electrode PE may be disposed on the first substrate 110.

The second substrate 150 may be a corresponding substrate opposite to the first substrate 110. A common electrode facing the pixel electrode PE may be disposed under the second substrate 150. A color filter defining a color of a pixel may be disposed under the second substrate 150. Alternatively, the common electrode may be disposed on the first substrate 110. The color filter may be disposed on the first substrate 110.

An overlap area between the first substrate 110 and the second substrate 150 may be substantially the same as the active region AA of the curved display panel 100. Alternatively, the overlap area between the first substrate 110 and the second substrate 150, except for the area where a sealing member is disposed, may be defined by the active region AA of the curved display panel 100.

The display apparatus may further include a display unit 170 interposed between the first and second substrates 110 and 150. The display unit 170 may include an organic light emitting layer. Alternatively, the display unit 170 may include a liquid crystal layer.

The curved display panel 100 may have a curved shape with respect to an axial direction z. For example, the curved display panel 100 may extend in a tangential direction θ with respect to the axial direction z.

The driver may include a plurality of data drivers 400 and a gate driver 300. The driver may apply a driving signal to the curved display panel 100. The controller may include a curved printed circuit board 200 having a curved shape with respect to the axial direction z. For example, the curved printed circuit board 200 may extend in the tangential direction θ with respect to the axial direction z. The controller may apply a control signal to the driver.

Each of the data drivers 400 may be electrically connected to one of the data lines DL of the curved display panel 100 to apply the driving signal to the one of the data lines DL.

Each of the data drivers 400 may be mounted on a respective one of the flexible substrates 500 as a chip on film (COF).

The gate driver 300 may be electrically connected to the gate lines GL of the curved display panel 100 to apply the driving signal to the gate lines GL.

The gate driver 300 may be directly mounted on the first substrate 110 of the curved display panel 100 as an amorphous silicon gate (ASG).

The curved printed circuit board 200 may include a control circuit such as a timing controller, a power voltage generator, etc. In addition, each of the flexible substrates 500 may include polyimide.

The timing controller receives input image data and an input control signal from an external apparatus. The input image data may include red image data, green image data and blue image data. The input control signal may include a master clock signal and a data enable signal. The input control signal may further include a vertical synchronizing signal and a horizontal synchronizing signal.

The timing controller generates a first control signal, a second control signal and a data signal based on the input image data and the input control signal.

The timing controller generates the first control signal for controlling an operation of the gate driver 300 based on the input control signal, and outputs the first control signal to the gate driver 300.

The timing controller generates the second control signal for controlling an operation of the data drivers 400 based on the input control signal, and outputs the second control signal to the data drivers 400.

The timing controller generates the data signal based on the input image data. The timing controller outputs the data signal to the data drivers 400.

The gate driver 300 generates gate signals driving the gate lines GL in response to the first control signal received from the timing controller. The gate driver 300 sequentially outputs the gate signals to the gate lines GL.

The data drivers 400 receive the second control signal and the data signal from the timing controller. The data drivers 400 convert the data signal into analog data voltages. The data drivers 400 output the data voltages to the data lines DL.

The control signal may include the first control signal, the second control signal and the data signal. The driving signal may include the gate signal and the data voltages.

The flexible substrate 500 may electrically connect the curved display panel 100 with the curved printed circuit board 200. In addition, each of the flexible substrates 500 may include polyimide.

Each of the flexible substrates 500 may include a first connection portion 515 connected to the curved display panel 100, a second connection portion 535 connected to the curved printed circuit board 200, and a flexible substrate body 525 connecting the first and second connection portions 515 and 535. The flexible substrate body 525 may extend in a radial direction r with respect to the axial direction z, as shown in FIG. 4.

For example, the first connection portions 515 may be spaced apart from one another by a constant distance to be connected to the curved display panel 100. In addition, the second connection portions 535 may be spaced apart from one another by a constant distance to be connected to the curved printed circuit board 200.

Alternatively, the first connection portions 515 may be spaced apart from one another by distances different from one another, and the second connection portions 535 may be spaced apart from one another by distances different from one another.

In addition, the first connection portions 515 may be connected to the peripheral region PA of the curved display panel 100. In an exemplary embodiment of the present invention, each of the first connection portions 515 may have a rectangular shape.

As illustrated in FIG. 4, the flexible substrates 500 may include first to fifth flexible substrates 510, 520, 530, 540 and 550. In addition, the data drivers 400 may include first to fifth data drivers 410, 420, 430, 440 and 450.

For example, each of the first to fifth data drivers 410, 420, 430, 440 and 450 may be mounted on a respective one of the first to fifth flexible substrates 510, 520, 530, 540 and 550.

The radial direction r may include first to fifth radial directions r1, r2, r3, r4 and r5.

For example, each of the flexible substrate bodies of the first to fifth flexible substrates 510, 520, 530, 540 and 550 may extend in a respective one of the first to fifth radial directions r1, r2, r3, r4 and r5.

The curved display apparatus 10, in accordance with an exemplary embodiment of the present invention, may include a flexible substrate body 525 of each of the flexible substrates 500 extending in the radial direction r with respect to the axial direction z. Accordingly, a stress transmitted to the flexible substrates 500 by the curved display apparatus 10 may be reduced. In addition, an electrical connection reliability of the flexible substrates 500 may be increased.

Figure 5:
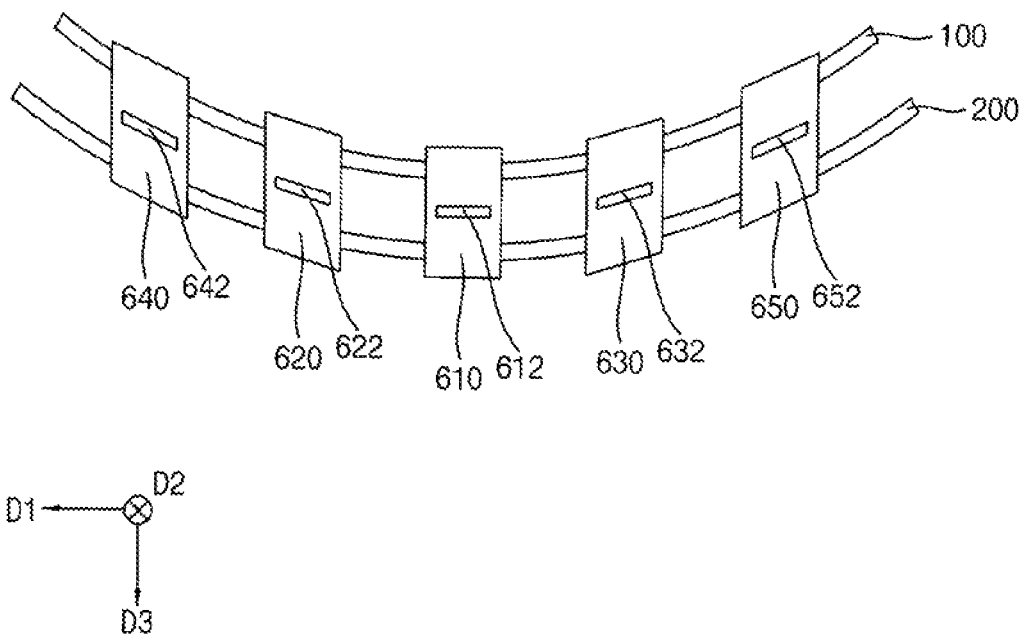
FIG. 5 is a perspective view illustrating a curved display apparatus according to a comparative embodiment.

FIG. 5 is a perspective view illustrating a curved display apparatus according to a comparative embodiment. Referring to FIG. 5, a conventional curved display apparatus includes first to fifth flexible substrates 610, 620, 630, 640 and 650 and first to fifth data drivers 612, 622, 632, 642 and 652.

The first to fifth flexible substrates 610, 620, 630, 640 and 650 may extend in a third direction D3 crossing the first and second directions D1 and D2.

Accordingly, stresses applied to the fourth flexible substrate 640 and the fifth flexible substrate 650 are greater than a stress applied to the first flexible substrate 610. Due to the stresses, an electrical connection reliability of the fourth and fifth flexible substrates 640 and 650 may decrease.

Figure 6:
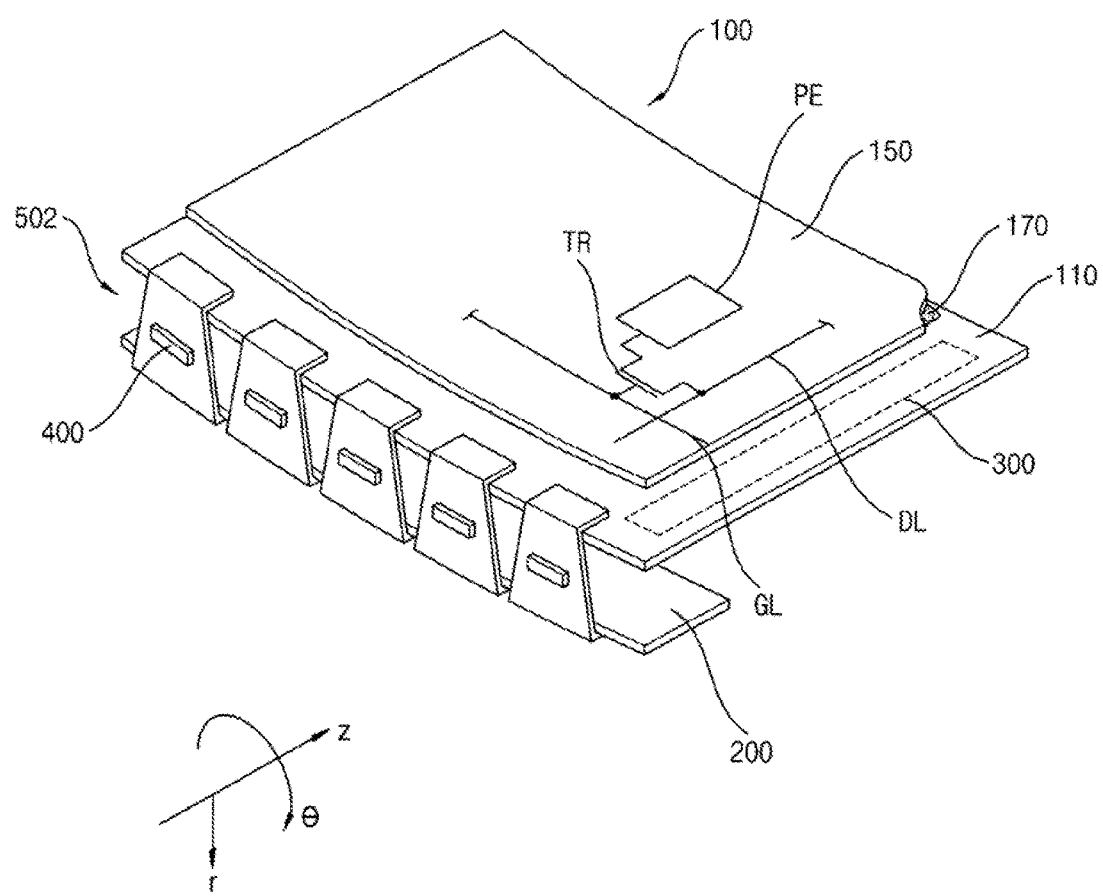
FIG. 6 is a perspective view illustrating a curved display apparatus according to an exemplary embodiment of the present invention.
Figure 7:
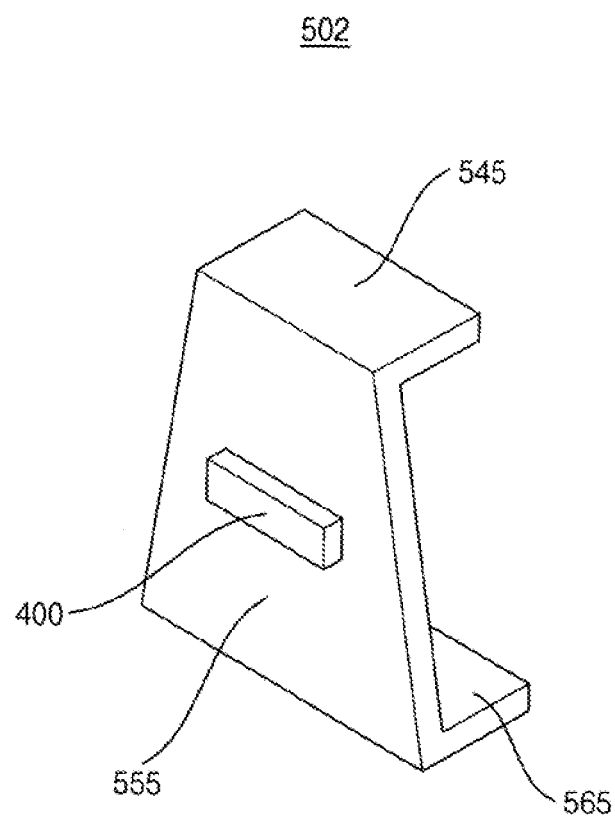
FIG. 7 is a perspective view illustrating a flexible substrate of FIG. 6, according to an exemplary embodiment of the present invention.
Figure 8:
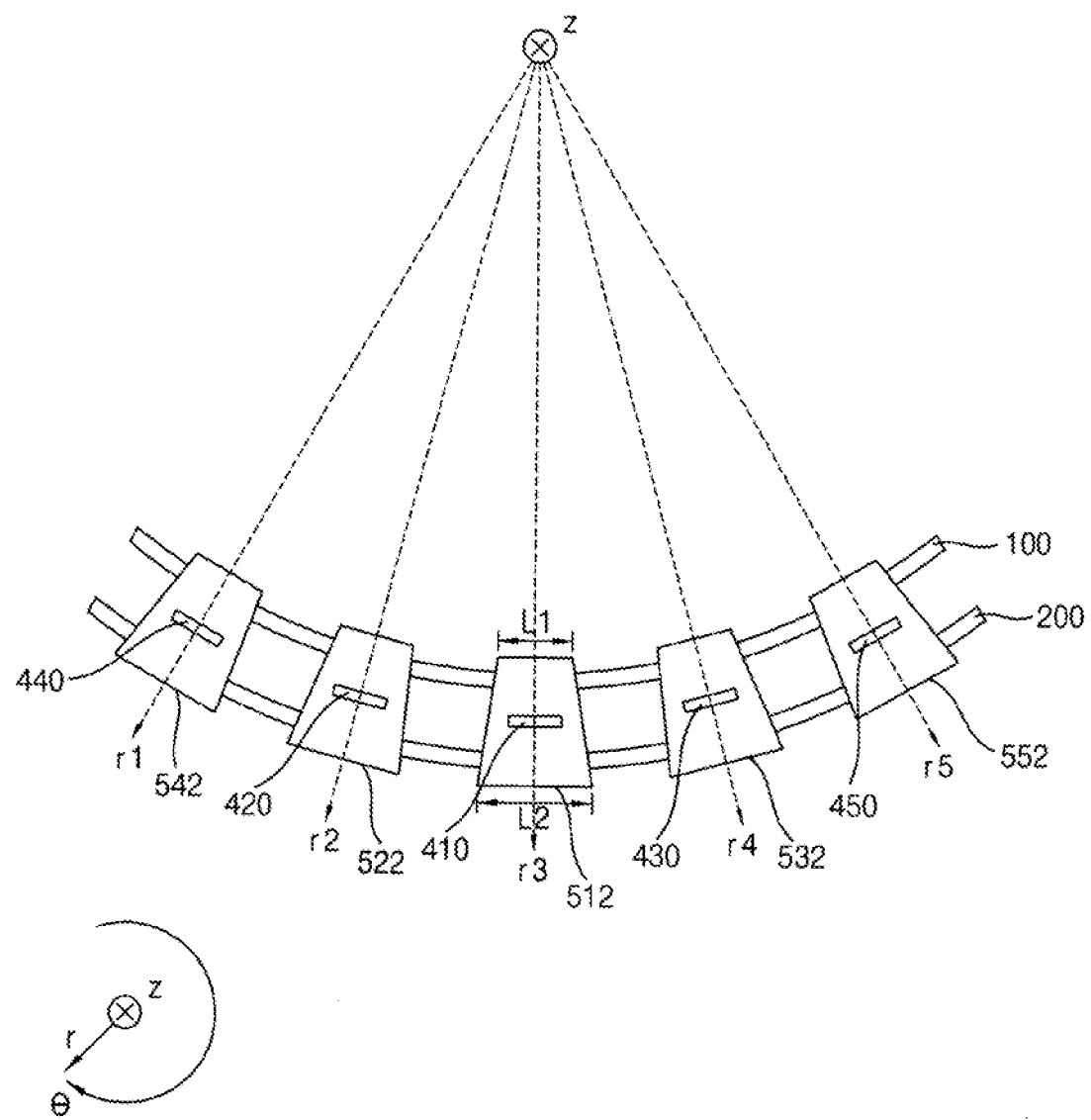
FIG. 8 is a side view in an axial direction illustrating the curved display apparatus of FIG. 6, according to an exemplary embodiment of the present invention.

FIG. 6 is a perspective view illustrating a curved display apparatus according to an exemplary embodiment of the present invention. FIG. 7 is a perspective view illustrating a flexible substrate of FIG. 6, according to an exemplary embodiment of the present invention. FIG. 8 is a side view in an axial direction illustrating the curved display apparatus of FIG. 6, according to an exemplary embodiment of the present invention. The curved display apparatus of FIGS. 6 to 8 may be substantially the same as that of FIGS. 1 to 3, except for a shape of flexible substrates. Thus, like reference numerals may refer to like elements, and repetitive explanations thereof may be omitted.

Referring to FIGS. 6 to 8, a curved display apparatus 12 includes a curved display panel 100, a driver, a controller, and a plurality of flexible substrates 502.

The curved display panel 100 includes an active region AA on which an image is displayed, and a peripheral region PA adjacent to the active region AA. The peripheral region PA does not display an image. The active region AA may be referred to as a display region.

The curved display panel 100 may include a first substrate 110 and a second substrate 150 opposite to the first substrate 110.

The curved display panel 100 may have a curved shape with respect to an axial direction z. For example, the curved display panel 100 may extend in a tangential direction θ with respect to the axial direction z.

The driver may include a plurality of data drivers 400 and a gate driver 300. The driver may apply a driving signal to the curved display panel 100. The controller may include a curved printed circuit board 200 having a curved shape with respect to the axial direction z. For example, the curved printed circuit board 200 may extend in the tangential direction θ with respect to the axial direction z. The controller may apply a control signal to the driver.

Each of the data drivers 400 may be electrically connected to one of the data lines DL of the curved display panel 100 to apply the driving signal to the data lines DL.

Each of the data drivers 400 may be mounted on a respective one of the flexible substrates 502 as a COP.

The gate driver 300 may be electrically connected to the gate lines GL of the curved display panel 100 to apply the driving signal to the gate lines GL.

The gate driver 300 may be directly mounted on the first substrate 110 of the curved display panel 100 as an ASG.

The curved printed circuit board 200 may include a control circuit such as a timing controller, a power voltage generator, etc.

In addition, each of the flexible substrates 502 may include polyimide. The flexible substrate 502 may electrically connect the curved display panel 100 with the curved printed circuit board 200.

Each of the flexible substrate 502 may include a first connection portion 545 connected to the curved display panel 100, a second connection portion 565 connected to the curved printed circuit board 200 and a flexible substrate body 555 connecting the first and second connection portions 545 and 565. The flexible substrate body 555 may extend in a radial direction r with respect to the axial direction z.

For example, the first connection portions 545 may be spaced apart from one another by a constant distance to be connected to the curved display panel 100. In addition, the second connection portions 565 may be spaced apart from one another by a constant distance to be connected to the curved printed circuit board 200.

Alternatively, the first connection portions 545 may be spaced apart from one another by distances different from one another, and the second connection portions 565 may be spaced apart from one another by distances different from one another.

As illustrated in FIG. 8, the flexible substrates 502 may include first to fifth flexible substrates 512, 522, 532, 542 and 552. In addition, the data drivers 400 may include first to fifth data drivers 410, 420, 430, 440 and 450.

For example, each of the first to fifth data drivers 410, 420, 430, 440 and 450 may be mounted on a respective one of the first to fifth flexible substrates 512, 522, 532, 542 and 552.

The radial direction r may include first to fifth radial directions r1, r2, r3, r4 and r5.

For example, each of the flexible substrate bodies of the first to fifth flexible substrates 512, 522, 532, 542 and 552 may extend in a respective one of the first to fifth radial directions r1, r2, r3, r4 and r5.

In an exemplary embodiment of the present invention, each of the flexible substrates 502 may have a trapezoidal shape. For example, a length L1 along the tangential direction θ, with respect to the axial direction z, of a first connection portion 545 of the first flexible substrate 512 may be less than a length L2 along the tangential direction θ, with respect to the axial direction z, of a second connection portion 565 of the first flexible substrate 512.

The curved display apparatus 12, in accordance with an exemplary embodiment of the present invention, may include a flexible substrate body 555 of each of the flexible substrates 502 extending in the radial direction r with respect to the axial direction z. Accordingly, a stress transmitted to the flexible substrates 502 by the curved display apparatus 12 may be reduced. In addition, an electrical connection reliability of the flexible substrates 502 may be increased.

Figure 9:
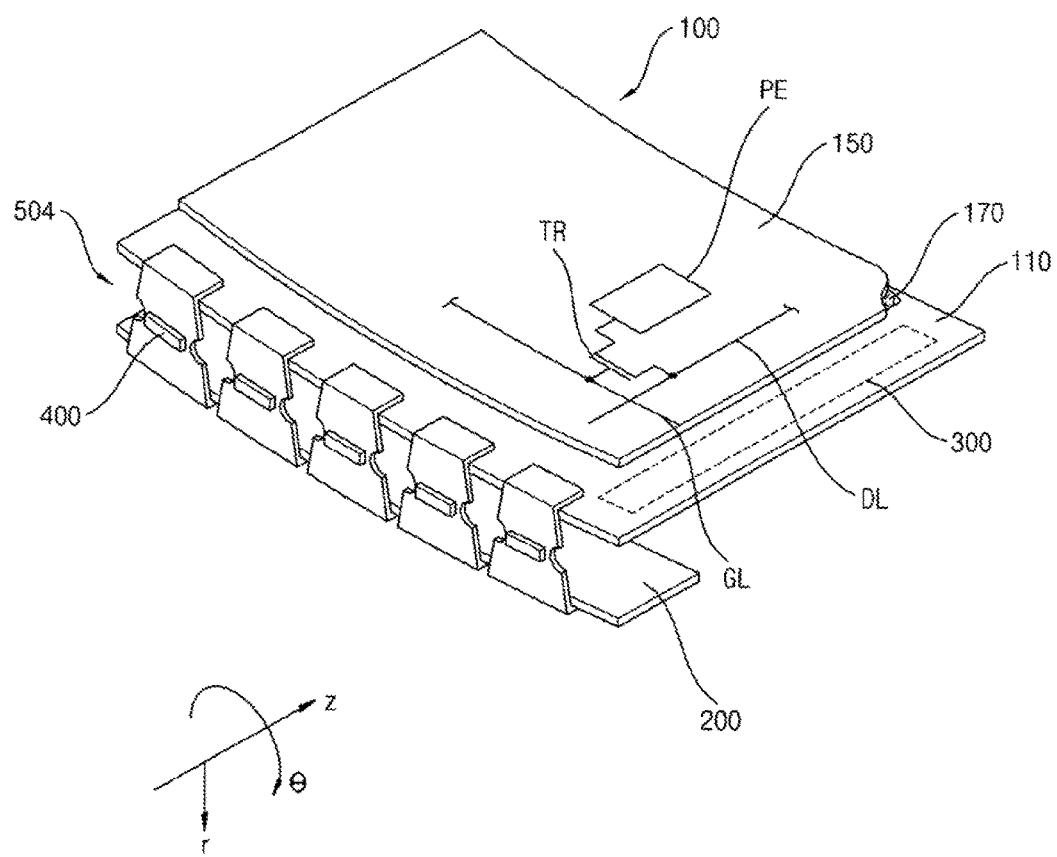
FIG. 9 is a perspective view illustrating a curved display apparatus according to an exemplary embodiment of the present invention.
Figure 10:
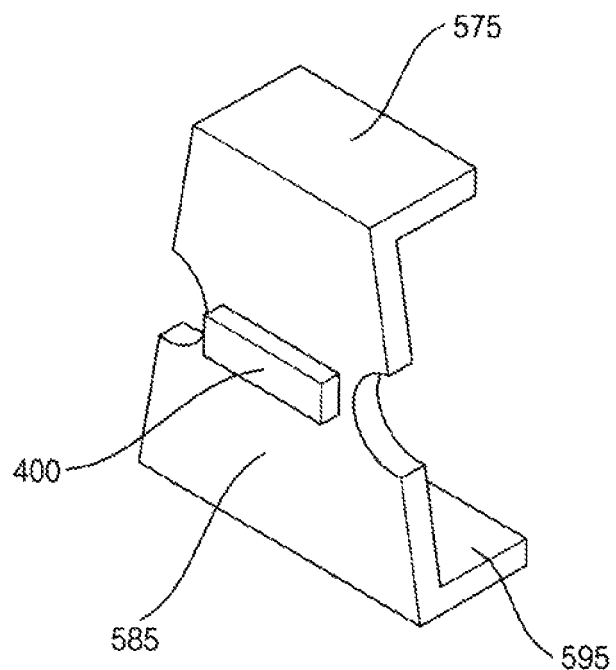
FIG. 10 is a perspective view illustrating a flexible substrate of FIG. 9, according to an exemplary embodiment of the present invention.
Figure 11:
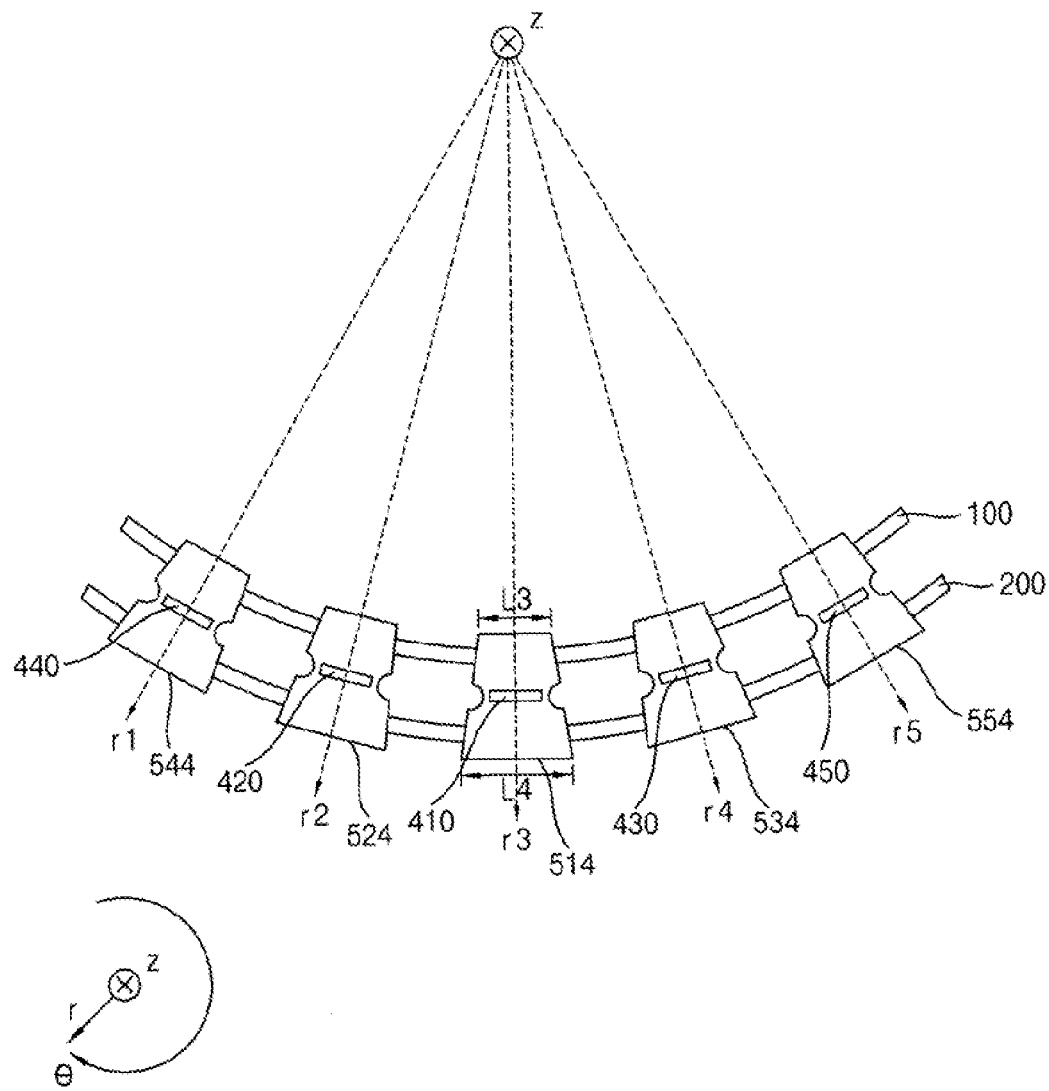
FIG. 11 is a side view in an axial direction illustrating the curved display apparatus of FIG. 9, according to an exemplary embodiment of the present invention.

FIG. 9 is a perspective view illustrating a curved display apparatus according to an exemplary embodiment of the present invention. FIG. 10 is a perspective view illustrating a flexible substrate of FIG. 9, according to an exemplary embodiment of the present invention. FIG. 11 is a side view in an axial direction illustrating the curved display apparatus of FIG. 9, according to an exemplary embodiment of the present invention. The curved display apparatus of FIGS. 9 to 11 may be substantially the same as that of FIGS. 1 to 3, except for a shape of flexible substrates. Thus, like reference numerals may refer to like elements, and repetitive explanations thereof may be omitted.

Referring to FIGS. 9 to 11, a curved display apparatus 14 includes a curved display panel 100, a driver, a controller, and a plurality of flexible substrates 504.

The curved display panel 100 includes an active region AA on which an image is displayed, and a peripheral region PA adjacent to the active region AA. The peripheral region PA does not display an image. The active region AA may be referred to as a display region.

The curved display panel 100 may include a first substrate 110 and a second substrate 150 opposite to the first substrate 110.

The curved display panel 100 may have a curved shape with respect to an axial direction z. For example, the curved display panel 100 may extend in a tangential direction θ with respect to the axial direction z.

The driver may include a plurality of data drivers 400 and a gate driver 300. The driver may apply a driving signal to the curved display panel 100. The controller may include a curved printed circuit board 200 having a curved shape with respect to the axial direction z. For example, the curved printed circuit board 200 may extend in the tangential direction θ with respect to the axial direction z. The controller may apply a control signal to the driver.

Each of the data drivers 400 may be electrically connected to one of the data lines DL of the curved display panel 100 to apply the driving signal to the data lines DL.

Each of the data drivers 400 may be mounted on a respective one of the flexible substrates 504 as a COF.

The gate driver 300 may be electrically connected to the gate lines GL of the curved display panel 100 to apply the driving signal to the gate lines GL.

The gate driver 300 may be directly mounted on the first substrate 110 of the curved display panel 100 as an ASG.

The curved printed circuit board 200 may include a control circuit such as a timing controller, a power voltage generator, etc.

In addition, each of the flexible substrates 504 may include polyimide. The flexible substrate 504 may electrically connect the curved display panel 100 with the curved printed circuit board 200.

Each of the flexible substrate 504 may include a first connection portion 575 connected to the curved display panel 100, a second connection portion 595 connected to the curved printed circuit board 200 and a flexible substrate body 585 connecting the first and second connection portions 575 and 595. The flexible substrate body 585 may extend in a radial direction r with respect to the axial direction z.

For example, the first connection portions 575 may be spaced apart from one another by a constant distance to connect the curved display panel 100. In addition, the second connection portions 595 may be spaced apart from one another by a constant distance to connect the curved printed circuit board 200.

Alternatively, the first connection portions 575 may be spaced apart from one another by distances different from one another, and the second connection portions 595 may be spaced apart from one another by distances different from one another.

As illustrated in FIG. 11, the flexible substrates 504 may include first to fifth flexible substrates 514, 524, 534, 544 and 554. In addition, the data drivers 400 may include first to fifth data drivers 410, 420, 430, 440 and 450.

For example, each of the first to fifth data drivers 410, 420, 430, 440 and 450 may be mounted on a respective one of the first to fifth flexible substrates 514, 524, 534, 544 and 554.

The radial direction r may include first to fifth radial directions r1, r2, r3, r4 and r5.

For example, each of the flexible substrate bodies of the first to fifth flexible substrates 514, 524, 534, 544 and 554 may extend in a respective one of the first to fifth radial directions r1, r2, r3, r4 and r5.

In an exemplary embodiment of the present invention, each of the flexible substrates 504 may have a dumbbell shape. A dumbbell shape may have notches or cavities in the middle of the shape. For example, the dumbbell shape of the flexible substrates 504 may be a shape in which the flexible substrate body 585 of a flexible substrate 504 may have notches or cavities toward the data driver 400 approximately at mid-length of the flexible substrate body 585. In addition, a length L3 along the tangential direction θ, with respect to the axial direction z, of a first connection portion 575 of the first flexible substrate 514 may be less than a length L4 along the tangential direction θ, with respect to the axial direction z, of a second connection portion 595 of the first flexible substrate 514.

The curved display apparatus 14, in accordance with an exemplary embodiment of the present invention, may include the flexible substrate body 585 of each of the flexible substrates 504 extending in the radial direction r with respect to the axial direction z. Accordingly, a stress transmitted to the flexible substrates 504 by the curved display apparatus 14 may be reduced. In addition, an electrical connection reliability of the flexible substrates 504 may be increased.

Figure 12:
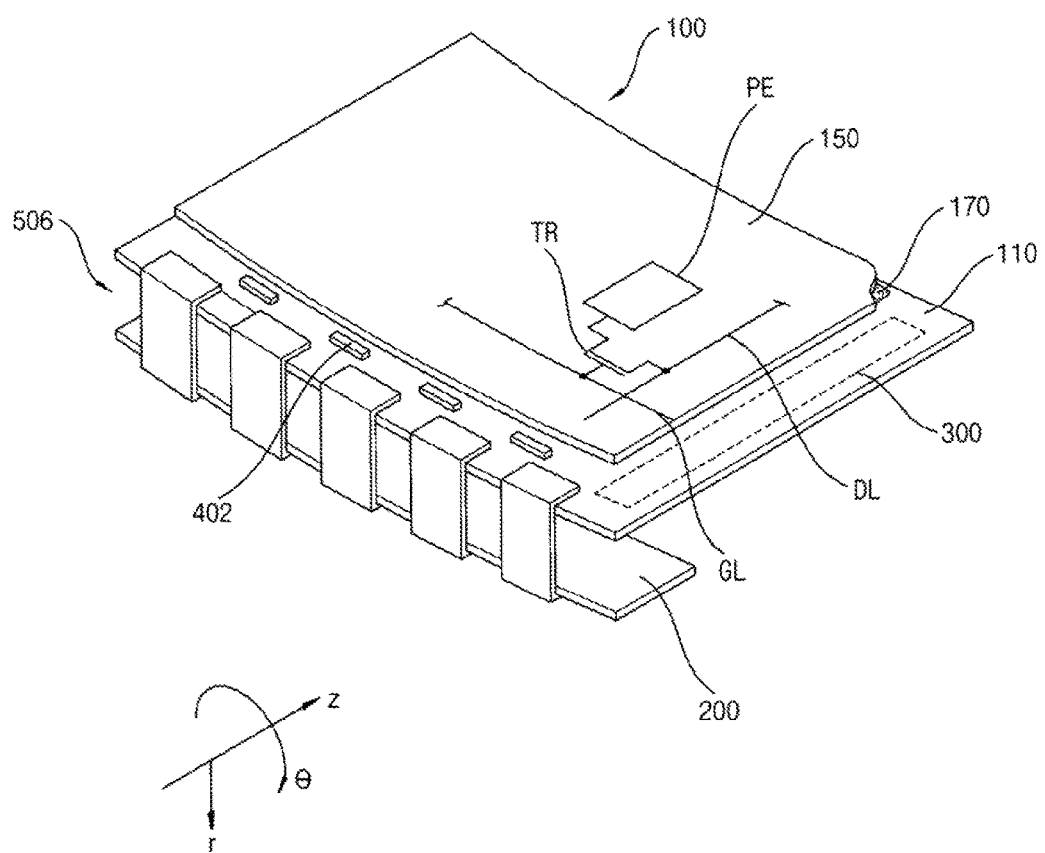
FIG. 12 is a perspective view illustrating a curved display apparatus according to an exemplary embodiment of the present invention.
Figure 13:
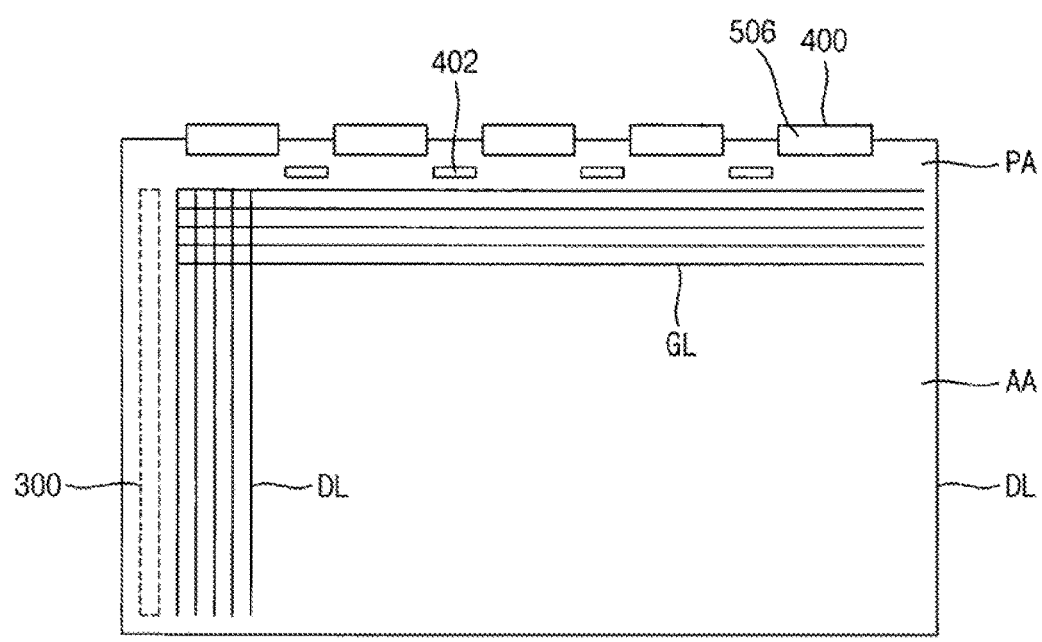
FIG. 13 is a plan view illustrating a flexible substrate of FIG. 12, according to an exemplary embodiment of the present invention.
Figure 14:
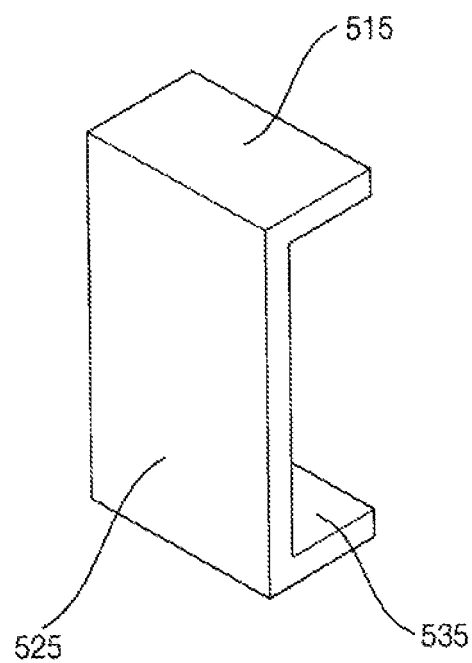
FIG. 14 is a perspective view illustrating a flexible substrate of FIG. 12, according to an exemplary embodiment of the present invention.
Figure 15:
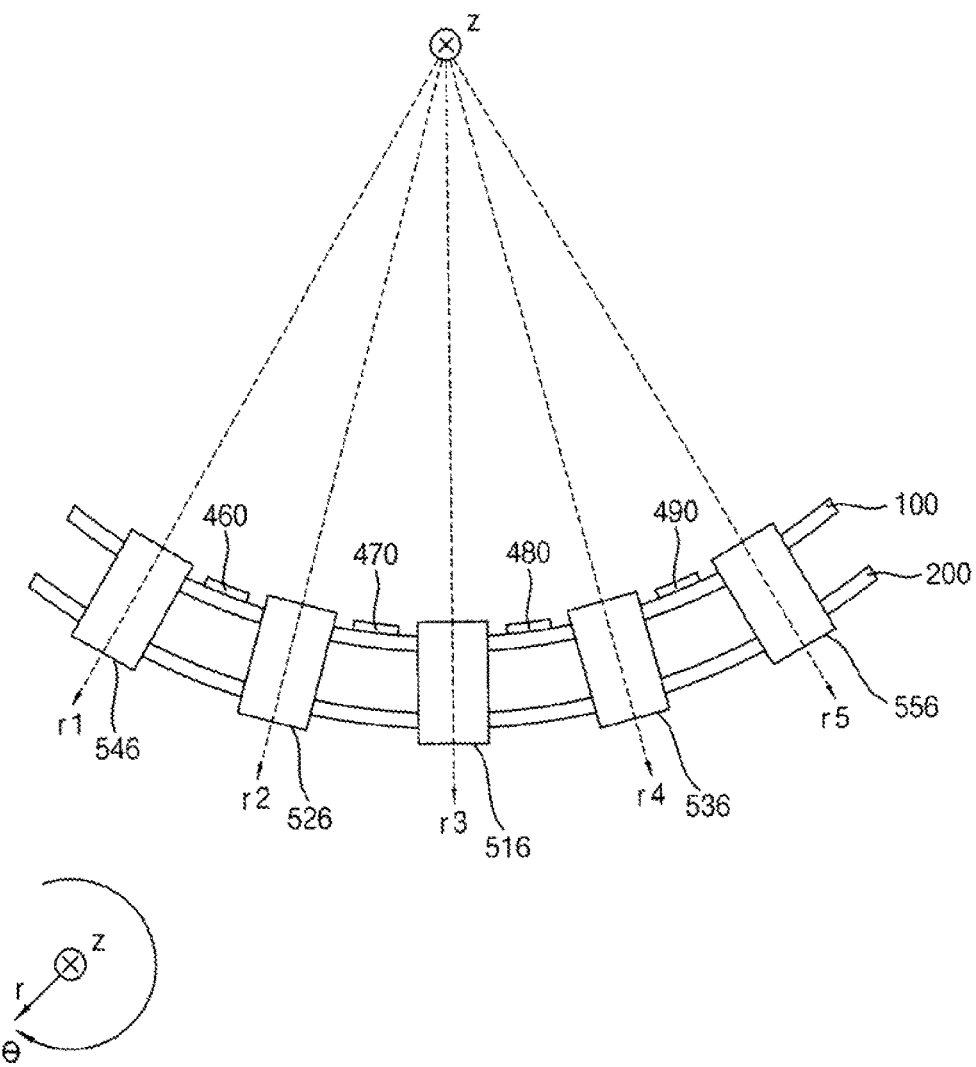
FIG. 15 is a side view in an axial direction illustrating the curved display apparatus of FIG. 12, according to an exemplary embodiment of the present invention.

FIG. 12 is a perspective view illustrating a curved display apparatus according to an exemplary embodiment of the present invention. FIG. 13 is a plan view illustrating a flexible substrate of FIG. 12, according to an exemplary embodiment of the present invention. FIG. 14 is a perspective view illustrating a flexible substrate of FIG. 12, according to an exemplary embodiment of the present invention. FIG. 15 is a side view in an axial direction illustrating the curved display apparatus of FIG. 12. A curved display apparatus of FIGS. 12 to 15 may be substantially the same as that of FIGS. 1 to 3, except for a chip type. Thus, like reference numerals may refer to like elements, and repetitive explanations thereof may be omitted.

Referring to FIGS. 12 to 15, a curved display apparatus 16 includes a curved display panel 100, a driver, a controller, and a plurality of flexible substrates 506.

The curved display panel 100 includes an active region AA on which an image is displayed, and a peripheral region PA adjacent to the active region AA. The peripheral region PA does not display an image. The active region AA may be referred to as a display region.

The curved display panel 100 may include a first substrate 110 and a second substrate 150 opposite to the first substrate 110.

The curved display panel 100 may have a curved shape with respect to an axial direction z. For example, the curved display panel 100 may extend in a tangential direction θ with respect to the axial direction z.

The driver may include a plurality of data drivers 402 and a gate driver 300. The driver may apply a driving signal to the curved display panel 100. The controller may include a curved printed circuit board 200 having a curved shape with respect to the axial direction z. For example, the curved printed circuit board 200 may extend in the tangential direction θ with respect to the axial direction z. The controller may apply a control signal to the driver.

Each of the data drivers 402 may be electrically connected to one of the data lines DL of the curved display panel 100 to apply the driving signal to the data lines DL.

Each of the data drivers 402 may be mounted on the first substrate 110 as a COG.

The gate driver 300 may be electrically connected to the gate lines GL of the curved display panel 100 to apply the driving signal to the gate lines GL.

The gate driver 300 may be directly mounted on the first substrate 110 of the curved display panel 100 as an ASG.

The curved printed circuit board 200 may include a control circuit such as a timing controller, a power voltage generator, etc.

In addition, each of the flexible substrates 506 may include polyimide. The flexible substrate 506 may electrically connect the curved display panel 100 with the curved printed circuit board 200.

Each of the flexible substrates 506 may include a first connection portion 515 connected to the curved display panel 100, a second connection portion 535 connected to the curved printed circuit board 200 and a flexible substrate body 525 connecting the first and second connection portions 515 and 535. The flexible substrate body 525 may extend in a radial direction r with respect to the axial direction z.

For example, the first connection portions 515 may be spaced apart from one another by a constant distance to be connected to the curved display panel 100. In addition, the second connection portions 535 may be spaced apart from one another by a constant distance to be connected to the curved printed circuit board 200.

Alternatively, the first connection portions 515 may be spaced apart from one another by distances different from one another, and the second connection portions 535 may be spaced apart from one another by distances different from one another.

As illustrated in FIG. 15, the flexible substrate 506 may include first to fifth flexible substrates 516, 526, 536, 546 and 556. In addition, the data drivers 402 may include first to fourth data drivers 460, 470, 480 and 490.

Each of the first to fourth data drivers 460, 470, 480 and 490 may be mounted on the first substrate 110. For example, each of the first to fourth data drivers 460, 470, 480 and 490 may be mounted on the peripheral region PA of the curved display panel 100.

The radial direction r may include first to fifth radial directions r1, r2, r3, r4 and r5.

For example, each of the flexible substrate bodies 525 of the first to fifth flexible substrates 516, 526, 536, 546 and 556 may extend in a respective one of the first to fifth radial directions r1, r2, r3, r4 and r5.

The curved display apparatus 16, in accordance with an exemplary embodiment of the present invention, may include the flexible substrate body 525 of each of the flexible substrates 506 extending in the radial direction r with respect to the axial direction z. Accordingly, a stress transmitted to the flexible substrates 506 by the curved display apparatus 16 may be reduced. In addition, an electrical connection reliability of the flexible substrates 506 may be increased.

Figure 16:
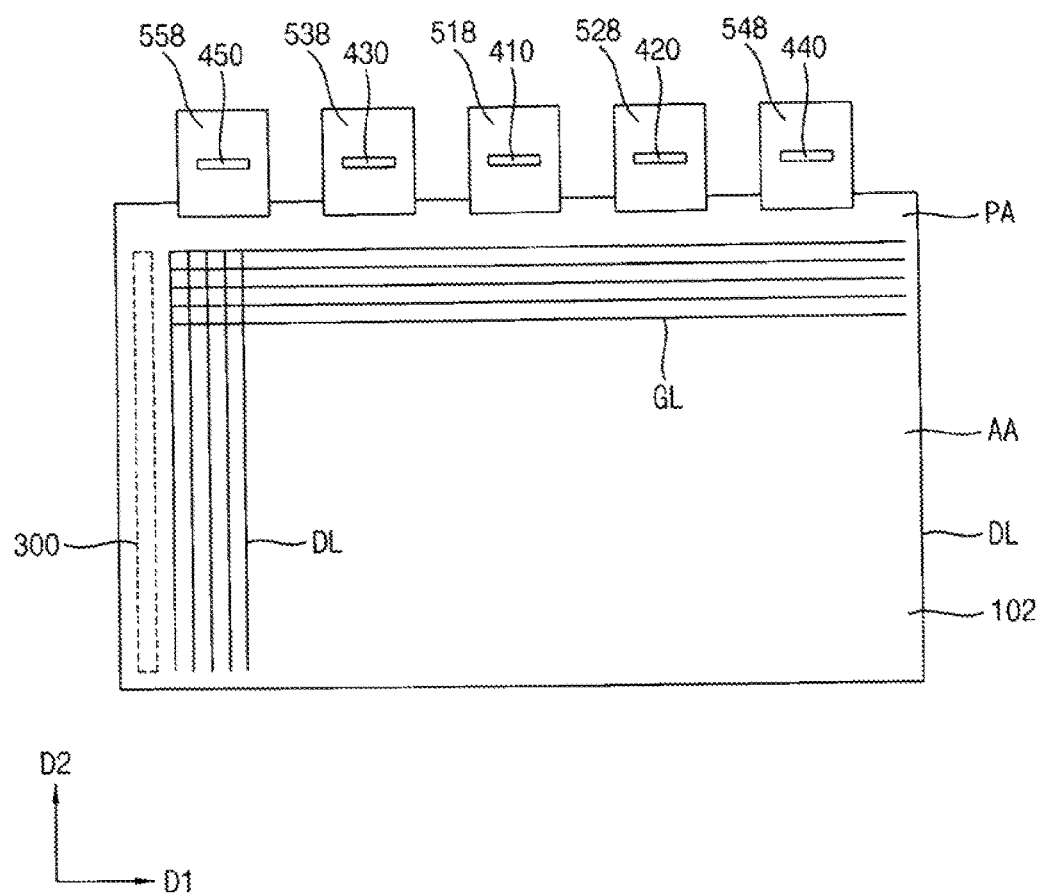
FIGS. 16 and 17 are plan views illustrating a method of manufacturing a curved display apparatus according to an exemplary embodiment of the present invention.
Figure 17:
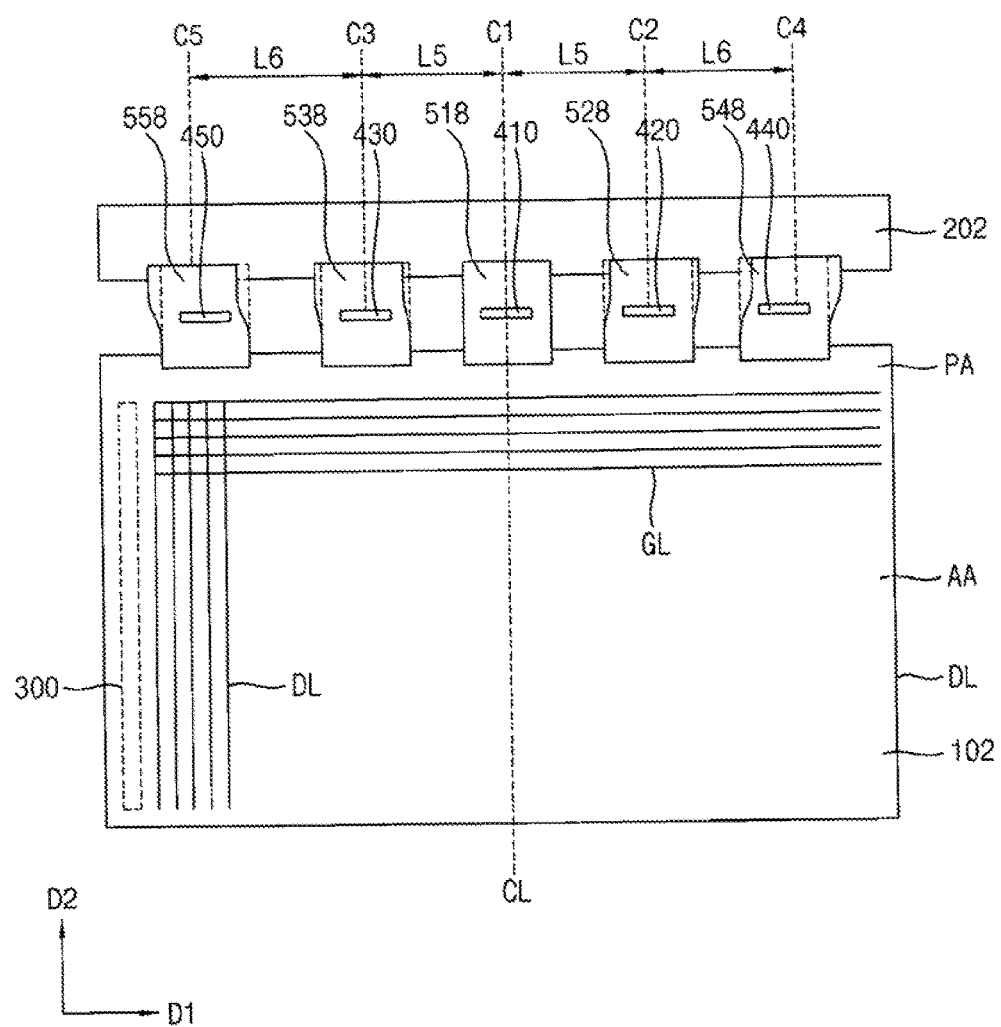

FIGS. 16 and 17 are plan views illustrating a method of manufacturing a curved display apparatus according to an exemplary embodiment of the present invention.

Referring to FIGS. 1, 3 and 16, a flat display panel 102 may be provided. The flat display panel 102 may include a first substrate 110 and a second substrate 150 facing the first substrate 110. The first substrate 110 may include a switching element TR and a pixel electrode PE electrically connected to the switching element TR.

A plurality of flexible substrates 500 may be provided on the flat display panel 102. Each of the flexible substrates 500 includes first and second connection portions 515 and 535, and a flexible substrate body 525 connecting the first and second connection portions 515 and 535.

For example, the flexible substrates 500 may include first to fifth flexible substrates 518, 528, 538, 548 and 558. A plurality of data drivers 410, 420, 430, 440 and 450 may be provided. Each of the data drivers 410, 420, 430, 440 and 450 may be mounted on a respective one of the first to fifth flexible substrates 518, 528, 538, 548 and 558.

The first connection portions of the first to fifth flexible substrates 518, 528, 538, 548 and 558 may be connected to a peripheral region PA of the flat display panel 102 along a first direction D1 by a thermal compression process. The first connection portion 515 of the first to fifth flexible substrates 518, 528, 538, 548 and 558 may be spaced apart from one another by a constant distance.

Referring to FIG. 17, a flat printed circuit board 202 may be provided. The second connection portions 535 of the first to fifth flexible substrates 518, 528, 538, 548 and 558 may be connected to the flat printed circuit board 202.

In an exemplary embodiment of the present invention, at least two second connection portions 535 adjacent to each other of the first to fifth flexible substrates 518, 528, 538, 548 and 558 may be spaced apart from each other by a first distance L5. At least another two second connection portions 535 adjacent to each other of the first to fifth flexible substrates 518, 528, 538, 548 and 558 may be spaced apart from each other by a second distance L6 different from the first distance L5.

The first distance L5 may be a distance between a center line C1 of the first flexible substrate 518 and a center line C2 of the second flexible substrate 528 or between the center line C1 of the first flexible substrate 518 and a center line C3 of the third flexible substrate 538.

The second distance L6 may be a distance between the center line C2 of the second flexible substrate 528 and a center line C4 of the fourth flexible substrate 548 or between the center line C3 of the third flexible substrate 538 and a center line C5 of the fifth flexible substrate 558.

In an exemplary embodiment of the present invention, a distance between two second connection portions 535 adjacent to each other may increase when a distance between a center line CL of the flat display panel 102 and the two second connection portions 535 increases. For example, the first distance L5 may be less than the second distance L6.

Referring to FIG. 1 and FIG. 17, the flat display panel 102 and the flat printed circuit board may be bent to have a curved shape to form the curved display panel 100 and the curved printed circuit board 200 shown in FIG. 1.

The curved printed circuit board 200 may be electrically connected to the curved display panel 100 through the flexible substrates 500. The curved printed circuit board 200 may be disposed to overlap the curved display panel 100 by bending the flexible substrates 500. For example, the first and second connection portions 515 and 535 may be created by bending the flexible substrates 500 so the curved printed circuit board 200 may be disposed to overlap the curved display panel 100.

According to the method of manufacturing the curved display apparatus 10, the flexible substrates 500 may extend in the radial direction r with respect to the axial direction z. Accordingly, a stress transmitted to the flexible substrates 500 by the curved display apparatus 10 may be reduced. In addition, an electrical connection reliability of the flexible substrates 500 may be increased.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A curved display apparatus comprising:
    a curved display panel including a first substrate and a second substrate facing the first substrate, wherein the curved display panel extends in a tangential direction with respect to a first axis direction, and the first substrate includes a switching element and a pixel electrode electrically connected to the switching element;
    a driver configured to apply a driving signal to the curved display panel;
    a controller including a curved printed circuit board extending in the tangential direction with respect to the first axis direction such that the curved display panel and the curved printed circuit board have an identical degree of curvature, wherein the controller is configured to apply a control signal to the driver; and
    a plurality of flexible substrates electrically connecting the curved printed circuit board with the curved display panel, wherein each of the plurality of flexible substrates includes:
        a first connection portion connected to the curved display panel;
        a second connection portion connected to the curved printed circuit board; and
        a flexible substrate body connecting the first connection portion with the second connection portion, wherein the flexible substrate body extends in a radial direction with respect to the first axis direction such that the flexible substrate body is tangential to both the curved display panel and the curved printed circuit board.

2. The curved display apparatus of claim 1, wherein the plurality of first connection portions are equally spaced apart from one another, and the plurality of second connection portions are equally spaced apart from one another.

3. The curved display apparatus of claim 1, wherein at least one of the plurality of flexible substrates has a rectangular shape.

4. The curved display apparatus of claim 1, wherein at least one of the plurality of flexible substrates has an isosceles trapezoidal shape.

5. The curved display apparatus of claim 4, wherein, for the at least one of the plurality of flexible substrates having the trapezoidal shape, a length of the first connection portion along the tangential direction with respect to the first axis direction is less than a length of the second connection portion along the tangential direction with respect to the first axis direction.

6. The curved display apparatus of claim 1, wherein at least one of the plurality of flexible substrates has a dumbbell shape.

7. The curved display apparatus of claim 6, wherein, for the at least one of the plurality of flexible substrates having the dumbbell shape, a length of the first connection portion along the tangential direction with respect to the first axis direction is less than a length of the second connection portion along the tangential direction with respect to the first axis direction.

8. The curved display apparatus of claim 1, wherein at least one of the plurality of flexible substrates includes polyimide.

9. The curved display apparatus of claim 1, wherein the curved display panel includes an active region configured to display an image and a peripheral region disposed adjacent to the active region, and wherein each of the plurality of first connection portions is connected to the peripheral region of the curved display panel.

10. The curved display apparatus of claim 1, wherein the driver includes a plurality of data drivers, and wherein each of the plurality of data drivers is mounted on a respective one of the plurality of flexible substrates as a chip on film (COF).

11. The curved display apparatus of claim 1, wherein the driver includes a plurality of data drivers, and wherein each of the plurality of data drivers is mounted on the first substrate of the curved display panel as a chip on glass (COG).

12. The curved display apparatus of claim 1, wherein the driver includes a gate driver, and wherein the gate driver is directly mounted on the first substrate of the curved display panel as an amorphous silicon gate (ASG).

13. The curved display apparatus of claim 1, wherein the curved display panel further includes a liquid crystal layer or an organic light emitting layer interposed between the first substrate and the second substrate.

14. A curved display apparatus comprising:
    a curved display panel including a first substrate and a second substrate facing the first substrate, wherein the curved display panel extends in a tangential direction with respect to a first axis direction, and the first substrate includes a switching element and a pixel electrode electrically connected to the switching element;

a driver configured to apply a driving signal to the curved display panel;

a controller including a curved printed circuit board extending in the tangential direction with respect to the first axis direction, wherein the controller is configured to apply a control signal to the driver; and a plurality of flexible substrates electrically connecting the curved printed circuit board with the curved display panel, wherein each of the plurality of flexible substrates includes:

a first connection portion connected to the curved display panel;

a second connection portion connected to the curved printed circuit board; and a flexible substrate body connecting the first connection portion with the second connection portion, wherein the flexible substrate body extends in a radial direction with respect to the first axis direction, wherein a first pair of adjacent first connection portions of the plurality of first connection portions are spaced apart from one another by a first distance, and a second pair of adjacent first connection portions of the plurality of first connection portions are spaced apart from one another by a second distance different than the first distance, and wherein a first pair of adjacent second connection portions of the plurality of second connection portions are spaced apart from one another by a third distance, and a second pair of adjacent second connection portions of the plurality of second connection portions are spaced apart from one another by a fourth distance different than the third distance.

15. A curved display apparatus comprising:

a curved display panel including a first substrate and a second substrate facing the first substrate, wherein the curved display panel is curved along a portion of a first imaginary circle, wherein the first substrate includes a switching element and a pixel electrode electrically connected to the switching element;

a driver configured to apply a driving signal to the curved display panel;

a controller including a curved printed circuit board, wherein the curved printed circuit board is curved along a portion of a second imaginary circle that has a same center as the first imaginary circle, wherein the controller is configured to apply a control signal to the driver; and a plurality of flexible substrates electrically connecting the curved printed circuit board with the curved display panel, wherein each of the plurality of flexible substrates includes:

a first connection portion connected to the curved display panel;

a second connection portion connected to the curved printed circuit board; and a flexible substrate body connecting the first connection portion with the second connection portion, wherein the flexible substrate body extends in a radial direction with respect to the center of the first imaginary circle, wherein each of the flexible substrate bodies have a trapezoidal shape, and wherein both legs of the trapezoidal shape of each of the flexible substrate bodies extend in the radial direction.

* * * * *